US008436677B2

(12) United States Patent
Kull et al.

(10) Patent No.: US 8,436,677 B2
(45) Date of Patent: May 7, 2013

(54) STRUCTURE FOR A REFERENCE VOLTAGE GENERATOR FOR ANALOG TO DIGITAL CONVERTERS

(75) Inventors: Lukas Kull, Rueschlikon (CH); Martin L. Schmatz, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 12/966,624

(22) Filed: Dec. 13, 2010

(65) Prior Publication Data

US 2012/0146712 A1 Jun. 14, 2012

(51) Int. Cl.
G05F 1/10 (2006.01)
G05F 3/02 (2006.01)

(52) U.S. Cl.
USPC .......................................................... 327/541

(58) Field of Classification Search ............... 327/538, 327/540, 541, 543
See application file for complete search history.

(56) References Cited

U.S. PATENT DOCUMENTS

| 6,194,265 B1 * | 2/2001 | Chang et al. ............... 438/255 |
| 6,204,108 B1 * | 3/2001 | Gau et al. ................. 438/238 |
| 6,316,987 B1 * | 11/2001 | Dally et al. ............... 327/538 |
| 6,333,623 B1 * | 12/2001 | Heisley et al. ............. 323/280 |
| 6,667,707 B2 * | 12/2003 | Mueck et al. ............... 341/172 |
| 7,071,664 B1 * | 7/2006 | Teggatz et al. ............. 323/280 |
| 2004/0266095 A1 * | 12/2004 | Oh et al. ................. 438/240 |
| 2006/0014307 A1 * | 1/2006 | Kweon ...................... 438/3 |
| 2009/0289291 A1 * | 11/2009 | Cheng et al. .............. 257/301 |
| 2009/0302421 A1 * | 12/2009 | Sardana et al. ............ 257/532 |
| 2009/0324851 A1 * | 12/2009 | Shih et al. ............... 427/579 |
| 2010/0109124 A1 * | 5/2010 | Tu ....................... 257/532 |

OTHER PUBLICATIONS

Yang, et al., "A 1-GS/s 6-bit 6.7-mW ADC in 65-nm CMOS", Berkley Wireless Research Center, Department of Electrical Engineering and Computer Sciences, UC Berkeley, Berkeley, CA, USA; retrieved on Nov. 8, 2010; pp. 1-4.
MAXIM, "Application Note 1080: Understanding SAR ADCs", Mar. 1, 2001; Copyright by Maxim Integrated Products; pp. 1-6.
Miyahara, et al., "A Low-Noise Self-Calibrating Dynamic Comparator for High-Speed ADCs", Tokyo Institute of Technology; Meguroku, Tokyo, Japan; Nov. 3-5, 2008/ Fukuoka, Japan; IEEE Asian Solid-State Circuits Conference; pp. 269-272.

* cited by examiner

*Primary Examiner* — Quan Tra
(74) *Attorney, Agent, or Firm* — Cantor Colburn LLP; Daniel Morris

(57) ABSTRACT

A design structure is provided for a reference voltage generator. The design structure includes a first capacitor and an analog to digital converter having its voltage reference coupled to the first capacitor. The first capacitor supplies the voltage reference to the analog to digital converter. A control loop is configured to resupply charges to the first capacitor that are lost when the first capacitor supplies the voltage reference to the analog to digital converter.

13 Claims, 6 Drawing Sheets

STRUCTURE FOR A REFERENCE VOLTAGE GENERATOR FOR ANALOG TO DIGITAL CONVERTERS

BACKGROUND

Exemplary embodiments relate to voltage generators, and more specifically, to a design structure for reference voltage generators for analog to digital converters.

One example of an analog to digital converter is the successive approximation register (SAR) analog to digital converter (ADC) which is frequently the architecture of choice for medium-to-high-resolution applications. SAR ADCs most commonly range in resolution from 6 to 16 bits and provide low power consumption as well as a small form factor. This combination makes them ideal for a wide variety of applications, such as portable/battery powered instruments, pen digitizers, industrial controls, and data/signal acquisition. As the name implies, the SAR ADC implements a search algorithm. Therefore, while the internal circuitry may be running at several megahertz (MHz) or gigahertz (GHz), the ADC sample rate is a fraction of that number due to the successive approximation algorithm.

BRIEF SUMMARY

According to exemplary embodiments, a circuit, method, and design structure are for a reference voltage generator. The circuit includes a first capacitor and an analog to digital converter having its voltage reference coupled to the first capacitor. The first capacitor supplies the voltage reference to the analog to digital converter. A control loop is configured to resupply charges to the first capacitor that are lost when the first capacitor supplies the voltage reference to the analog to digital converter Additional features are realized through the techniques of the present disclosure. Other systems, methods, apparatus, and/or computer program products according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

DETAILED DESCRIPTION

Analog to digital converters (ADC) in general need one or several reference voltages. In the case of successive approximation (SAR) ADC, capacitors within the SAR are switched from a first reference voltage (such as, e.g., Vref,P) to a second reference voltage (such as, e.g., Vref,N) during the conversion of the bits, e.g., during the conversion of the signal from analog to digital. Switching from the first reference voltage to the second reference voltage is equivalent to injecting charges to the reference voltages.

For high conversion rates (e.g., giga-samples per second (GS/s)), it is very common to operate a number of slower SARs in an interleaved fashion. To achieve a certain specified conversion speed, the capacitor reference voltages in the SAR need to settle to a given bit accuracy within (a part of) the conversion time. This implies that the voltage reference impedance needs to be small enough as to allow this resistor-capacitor (RC)-settling to happen. The required value of the voltage reference impedance can typically be in the few ohm region. Building low impedance reference voltages may be considered difficult, because the voltage source needs a lot of power and area.

Exemplary embodiments provide techniques to generate this reference voltage for the SAR ADC. A reference generator 20 (shown in FIGS. 1-4) is provided herein to create a voltage reference Vref, which could be the first voltage reference Vref,P and/or the second voltage reference Vref,N. Also, a second reference generator identical to the reference 20 may provide the other voltage reference not provided by the reference generator 20. Exemplary embodiments provide a technique to use a fully dynamic reference voltage stored on a large capacitor Cref to provide the voltage reference Vref as described herein.

Figure 1:
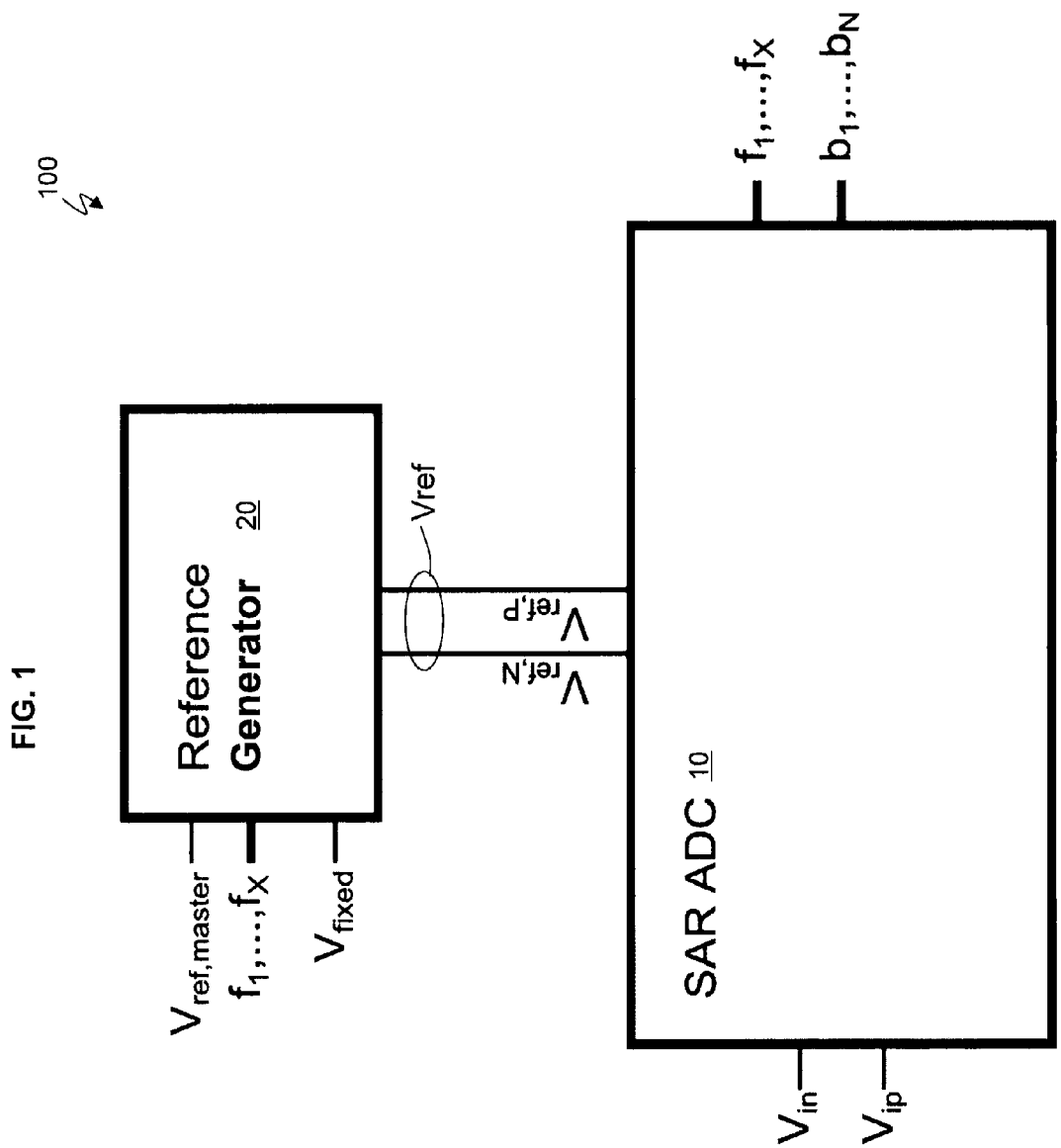
FIG. 1 illustrates an example of an analog to digital system in accordance with exemplary embodiments.

Now turning to the figures, FIG. 1 illustrates an example of an SAR ADC system 100 according to exemplary embodiments.

The system 100 comprises the SAR ADC 10 operatively connected to the reference generator 20. Vin and Vip are the differential input signal of the SAR ADC 10. It is contemplated that the SAR ADC 10 could be single ended as well. B1 . . . bN are the binary outputs of the SAR ADC 10, i.e., the digital signal converted from an analog signal. Vref,N and Vref,P are the input negative and positive reference voltages required by the SAR ADC 10.

The system 100 includes the reference generator 20 configured to provide voltage to the SAR ADC 10, and the reference generator 20 may be referred to as voltage reference generator. Vfixed can be any low-impedance fixed voltage, e.g., ground or a supply voltage. Vref,master is a high-impedance master reference voltage (i.e., a voltage source).

Figure 2:
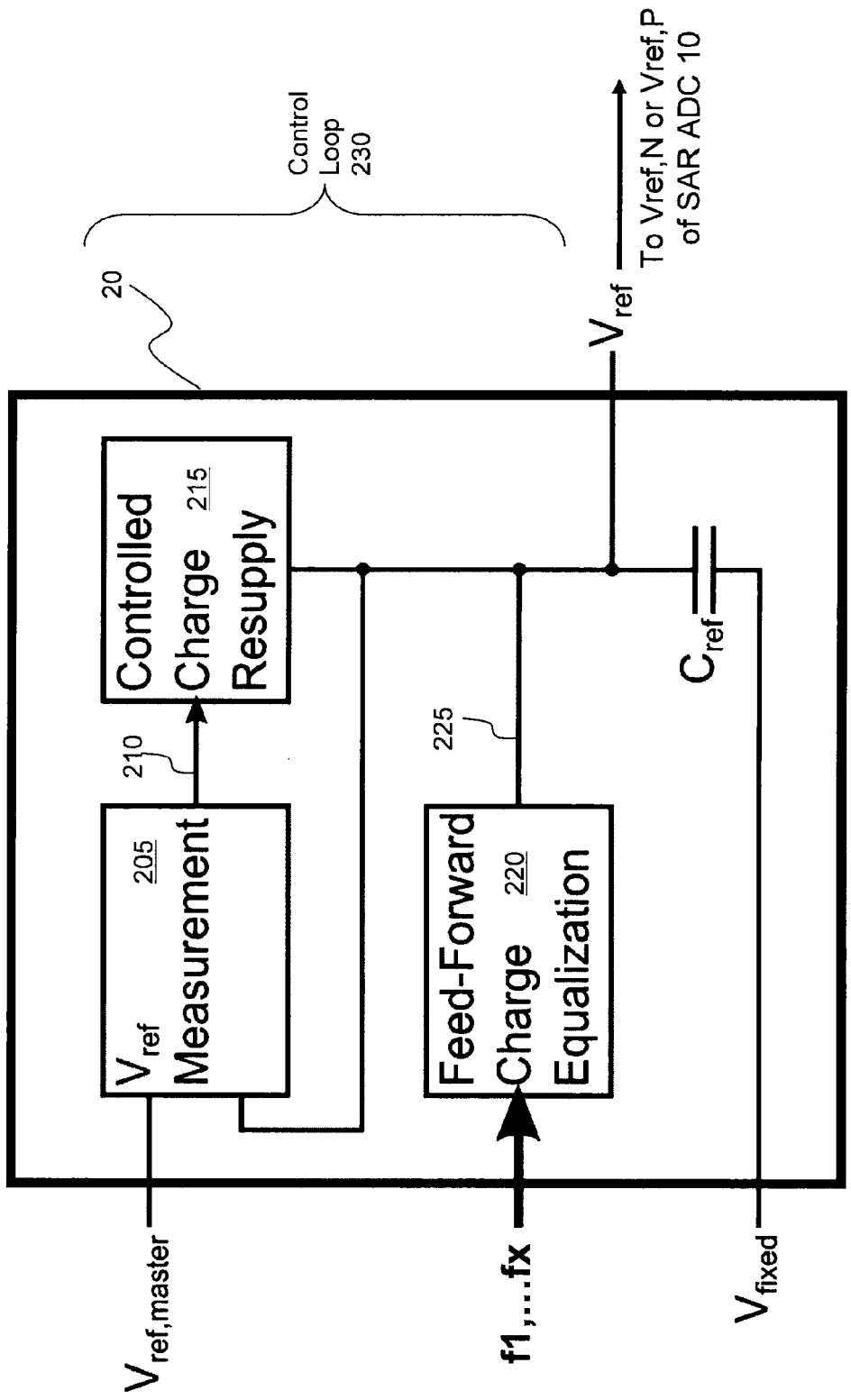
FIG. 2 illustrates a block diagram of a reference generator in accordance with exemplary embodiments.
Figure 3:
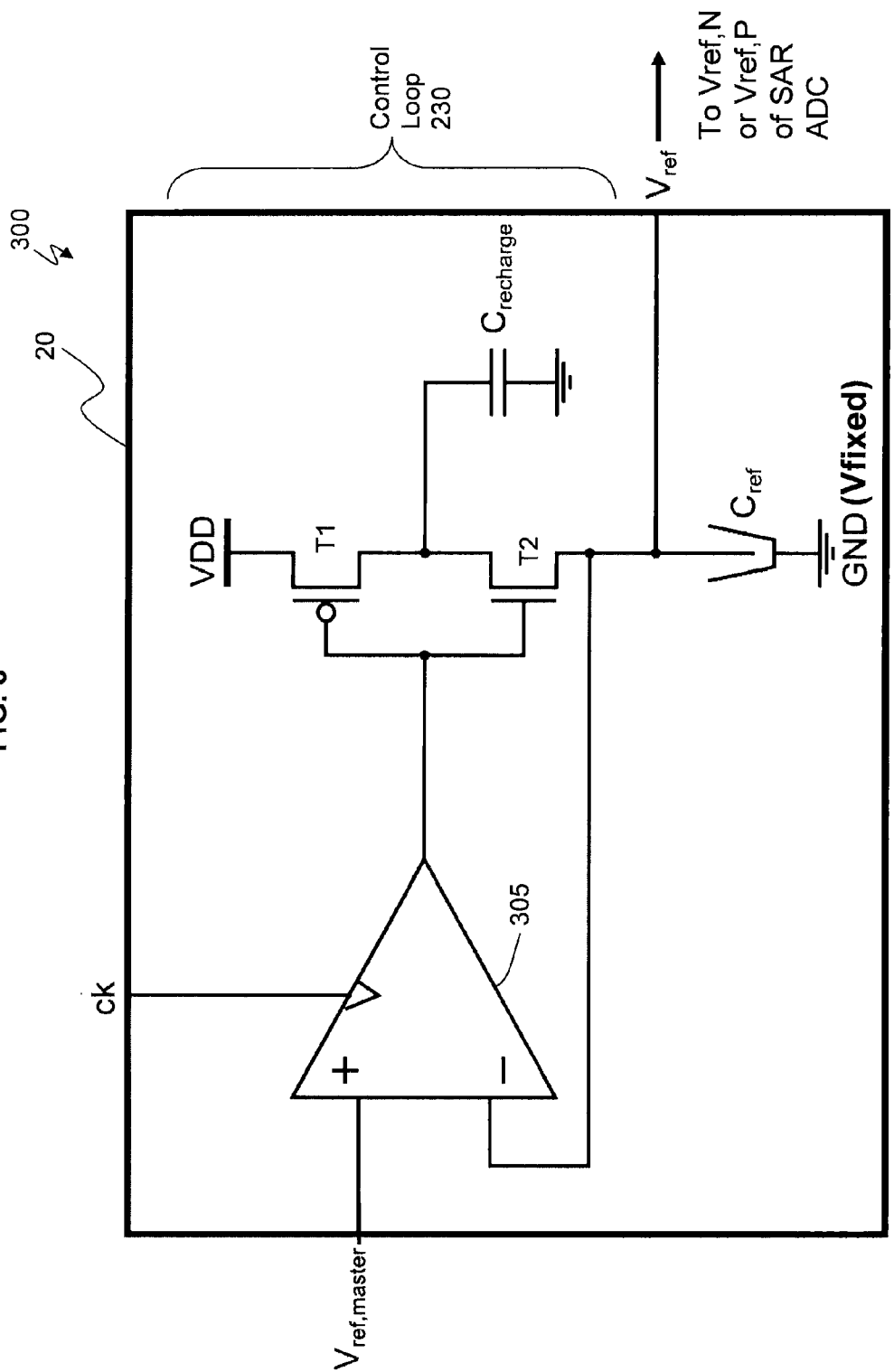
FIG. 3 illustrates an example implementation for a capacitive reference generator in accordance with exemplary embodiments.

F1 . . . fX is an optional set of feed forward signals for forward charge equalization. The f1 . . . fX signals (output from the SAR ADC 10) could be used as an input to the reference generator 20 to instantly cancel any charge withdrawn from Cref (inside the reference generator 20 as shown in FIGS. 2 and 3) that is caused by switching capacitors in the capacitor array 402 (shown in FIG. 4) of the SAR ADC 10. An example configuration would be a replica of the capacitors 402 of the SAR ADC 10, being switched at the same time as the capacitors 402 of the SAR ADC 10 and having exactly the opposite impact on Cref. Cref may be implemented as a large capacitor and/or an array of large capacitors.

FIG. 2 illustrates a block diagram of the reference generator 20 according to exemplary embodiments.

In FIG. 2, inputs on the left side of the reference generator 20 are as described before, e.g., Vref,master, Vfixed, and f1 . . . fx. For the output on the right side of the reference generator 20, Vref output from the reference generator 20 can either be used for Vref,N or Vref,P input into the SAR ADC 10. The other voltage reference (Vref,N or Vref,P) could be generated the same way as shown in FIG. 2 but with a Vref, master2 (not shown) connected to a second reference generator 20 (not shown), and/or the other voltage reference could be set to a fixed voltage, e.g., such as ground or a supply voltage. The SAR ADC 10 is not shown in FIG. 2 so as not to unnecessarily obstruct FIG. 2.

The top side of Cref has a voltage (Vref) very close to the voltage Vref,master (or with some constant offset), e.g., when the voltage Vref of Cref is measured to ground. Ideally, Vref equals Vref,master (or Vref,master+constant offset). The bottom side (e.g., Vfixed) of the capacitor Cref is set to a low-impedance node, e.g., ground (as described above).

Vref measurement 205 is configured to measure Vref utilizing a voltage measurement technique (as understood by one skilled in the art) and compare Vref to Vref,master. Depending on the result of the comparison made by the Vref measurement 205, the control signal 210 (generated by Vref measurement 205) input into the controlled charge resupply 215 is adjusted. The controlled charge resupply 215 adds and/or subtracts charges from Cref depending on the output control signal 210 of Vref measurement 205. For example, from the comparison between Vref to Vref,master, when the Vref measurement 205 determines that Vref is less than Vref, master (e.g., by a predefined amount or more), Vref measurement 205 generates the control signal 210 to cause the controlled charge resupply 215 to charge Cref (i.e., add charges to the capacitor Cref). When the Vref measurement 205 determines that Vref is greater than Vref,master (e.g., by a predefined amount or more), the Vref measurement 205 generates the control signal 210 to cause the controlled charge resupply 215 to subtract (0 or more) charges from Cref. Additionally, when the Vref measurement 205 determines that Vref is within the voltage of Vref, master (e.g., within a predefined tolerance, which might be zero as well), Vref measurement 205 does generate the control signal 210 to turn on the controlled charge resupply 215 and no charges are added to or subtract from Cref.

Vref measurement 205 is configured to continuously compare Vref and Vref,master and/or at compare Vref and Vref, master at discrete time instances.

The controlled charge resupply 215 could be implemented as a charge pump, a switch capacitor, and/or any other means or combination of circuitry which allows a current to flow into and/or out from Cref.

The capacitor Cref has to be larger than the digital to analog (DAC) capacitor array 402 (in FIG. 4) unless feed-forward charge equalization 220 is used. If no feed forward is applied by a feed-forward charge equalization 220, a general estimation is:

$$\text{Cref} = (C_{DAC,Total}) * 2^{(N+1)}, \quad \text{Equation 1}$$

where ($C_{DAC,Total}$) is the total capacitance of the DAC capacitor array 402, wherein Cref is a capacitance (capacitor size), and where N is the number of bits for the SAR DAC 10. This limits the error to half a least significant bit (LSB). The precision of the presented reference voltage Vref is only affected by capacitor size of Cref and the total resistance between Cref and the SAR DAC 10. The larger the capacitor size (i.e., capacitance) of Cref, the greater precision of Vref.

In one implementation of exemplary embodiments, Cref is implemented as a plurality of high-density capacitors. Examples are deep trench (DT) capacitors, dynamic random access memory (DRAM) capacitors, metal-insulator-metal (MIM) capacitors, etc. If deep trench capacitors are utilized, the deep trench capacitors can make use of the same area as is used by the DAC capacitor array 402. For example, the DT capacitor that comprises Cref can be formed on the wafer (not shown) under the DAC capacitor array 402.

In FIG. 2, the feed-forward charge equalization 220 may be implemented as a (scaled) replica of the DAC capacitor array 402. In one implementation, the feed-forward charge equalization 220 includes some means of controlled charge resupply and adds or subtracts charges with connection 225 (in addition to and/or alternatively to the control signal 210 provided to the controlled charge resupply 215); the signals f1 . . . fX instruct the feed-forward charge equalization 220 to add or subtract charges to/from Cref at the same time when the DAC capacitor array 402 switches the same amount utilized by the DAC capacitor array 402 (during contemporaneous switching and/or previous switching of the capacitors in the DAC capacitor array 402). Simpler implementations would be possible as well, for example to add charge during the conversion cycle not based on the actual SAR DAC setting, but to compensate for average charge loss.

A control loop 230 for resupplying charges (i.e., voltage) to the capacitor Cref may comprise the Vref measurement 205 and the controlled charge resupply 215. Optionally, the control loop 230 may additionally include the feed-forward charge equalization circuit 220.

FIG. 3 illustrates a circuit 300 as an example of an implementation for a pure capacitive reference generator 20 in accordance with exemplary embodiments.

In this example implementation, Cref is a large deep trench (DT) capacitor. A comparator 305 implements the Vref measurement 205. Transistors T1 (which is a P-MOS transistor) and T2 (which is an N-MOS transistor) are coupled at their gates to the output of the comparator 305. The source of T1 is coupled to VDD which is a voltage source. VDD is higher than the voltage reference Vref The drain of T1 and the drain of T2 are coupled to the top of a capacitor $C_{recharge}$. The bottom of $C_{recharge}$ is coupled to ground (or any other fixed voltage). $C_{recharge}$ recharges Cref through T2 when T2 is turned on by the output of the comparator 305 and when T1 is turned off by the output of the comparator 305. T1, T2, and $C_{recharge}$ implement the controlled charge resupply 215.

Ck is the clock of the comparator 305 which initiates a comparison by the comparator 305 between Vref,master and Vref. If Vref is smaller than Vref,master, a high output (e.g., logic 1) from the comparator 305 causes the capacitor $C_{recharge}$ to be disconnected from VDD through T1 and to be connected to Cref through T2. The step size for recharging Vref is $$V\text{diff} = C_{recharge} * (VDD - V\text{ref}) / \text{Cref} \quad \text{Equation 2}$$

for Cref>>$C_{recharge}$ (i.e., Cref is much greater in capacitance than $C_{recharge}$).

In Equation 2, Vdiff is the difference between Vref after the recharging process and Vref before the recharging process, Vref is the measured voltage of Cref (to ground), $C_{recharge}$ is the capacitance (which corresponds to the voltage at $C_{recharge}$) for capacitor $C_{recharge}$, and Cref is the capacitance for the capacitor Cref (which corresponds to the voltage Vref at Cref).

For an example of a 7 bit (i.e., N=7) SAR ADC 10 and a unit capacitor size in the DAC capacitor array 402 of 2 femtofarads (fF), the total capacitance in the DAC capacitor array 402 is 256 fF. The capacitance Cref is chosen to be at least $2^8$ ($2^{N+1}$) times larger (i.e., larger than 65 pF) than the total capacitance in the DAC capacitor array 402.

The clock ck is active after the SAR comparison is finished by the DAC capacitor array 402. The comparison by the DAC capacitor array 402 and the recharge by T1, T2, and $C_{recharge}$ (making up the controlled charge resupply 215) can be performed in parallel to the offset calibration of the latches (which are implemented in the SAR ADC logic 406 shown in FIG. 4) in the SAR ADC 10. Accordingly, no additional time is required to stop the SAR ADC 10 for recharging the capacitor Cref Instead, Cref is recharged by T1, T2, and $C_{recharge}$ during the offset calibration of the SAR ADC logic 406 and/or during the comparison by the capacitors in the DAC capacitor array 402.

In FIG. 3, the control loop 230 may include the comparator 305, T1, T2, $C_{recharge}$, VDD, and Vref,master. The control loop 230 is configured to charge Cref as discussed herein, so that Cref can supply Vref.

Figure 4:
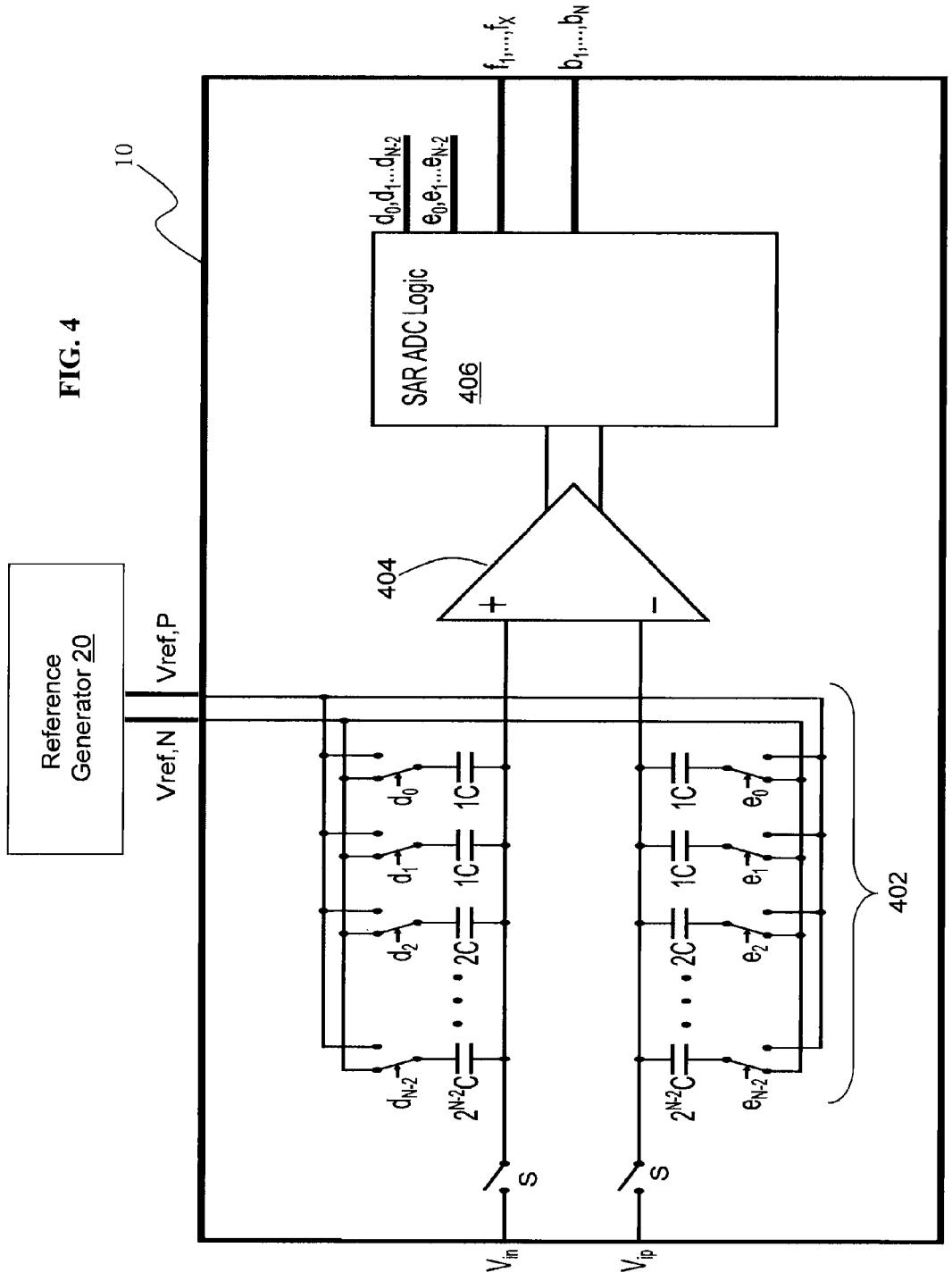
FIG. 4 illustrates an example of a successive approximation register implementation which can be coupled to the reference generator in accordance with exemplary embodiments.

With reference to FIG. 4, during operation (bit conversions) of the SAR DAC 10, the DAC capacitor array 402 would be switched between Vref,N and Vref,P (e.g. Vref,P connected to the deep trench capacitor Cref and Vref,N connected to ground), and Cref is not connected to any voltage supply such as VDD during that time. This is a capacitor-to-capacitor charge transfer, which is extremely fast and can be in the order of a few picoseconds as would be understood by one skilled in the art. After completion of the bit conversions and/or during the SAR ADC 10 calibration cycles, the comparator 305 is configured to measure whether or not the voltage Vref of Cref is larger or smaller than the external master reference voltage Vref,master and then pump some correction charges accordingly (i.e., add charge to Cref or take charges away from Cref).

Please note that the external master reference voltage Vref, master is not loaded and that the SAR ADC 10 cannot interact with Vref,master. This is beneficial because there is inherently no voltage drop in the reference distribution wires connecting Vref,master to the different instances of SAR ADC 10.

FIG. 4 illustrates an example of an SAR implementation which can be coupled to the reference generator 20 according to exemplary embodiments. FIG. 4 is one example in which the voltage reference generator 20 may be utilized and is not meant to be limiting.

In FIG. 4, VrefiN or Vref,P can be coupled to Vref of the reference generator 20 while the other one is coupled to ground. The SAR ADC 10 includes the DAC capacitor array 402, a comparator 404, and SAR ADC logic (i.e., memory, state-machine, logic) 406.

The capacitors in the DAC capacitor array 402 on the left side of the comparator 404 generate a voltage out of digital values. First, the switches S connecting Vin and Vip to the DAC capacitor array 402 are closed for some time to sample a voltage onto the DAC capacitor array 402. Then, the comparator 404 decides on whether the input signal (of Vin-Vip or Vip-Vin) is positive or negative. Depending on the outcome, the bits d0 ... dN−2 and e0 ... eN−2 are set by the SAR ADC logic 406 in order to adjust the input voltage of the comparator 404. This can, in the simplest case, be a direct feedback from the latch to the capacitors where switches direct the latch output to the corresponding capacitors depending on the cycle. This procedure is repeated until the required number of bits is present at the output of the SAR ADC 10. The output bits b1 ... bN can be generated from the latch decision output of the SAR ADC logic 406.

In order to work correctly, the difference between Vref,N and Vref,P has to be related the input difference amplitude (amplitude of Vin-Vip). In an ideal ADC, Vref,P-Vref,N is equal to the maximum allowed difference Vip-Vin.

In the SAR ADC 10, the individual capacitors of the DAC capacitor array 402 are switched between Vref,N and Vref,P (where Vref,N and/or Vref,P is connected to a large capacitor Cref) during the individual bit conversion steps of the DAC capacitor array 402, rather than to a voltage source such as VDD. This reference capacitor Cref is usually significantly larger than the capacitors in the DAC capacitor array 402 (however, if the feed-forward charge equalization 220 is utilized, reference capacitor Cref does not need to be significantly larger that the DAC capacitor array 402). Consequently, the voltage change on the reference capacitor Cref is small when one or several of the capacitors in the DAC capacitor array 402 are switching and thereby injecting their charge to the reference capacitor Cref Voltage change of Cref is smaller than one least significant bit (LSB) of the SAR ADC 10.

To reduce reference voltage variation, when one (or more) of the capacitors in the DAC capacitor array 402 switches and thereby adds and/or subtracts charge to and/or from the reference capacitor Cref, an equal (or similar) charge is applied to respectively subtract and/or add the same (or similar) amount of charge (via $C_{recharge}$) from/to the reference capacitor Cref as instructed by the feed-forward charge (compensation) equalization circuit 220 in one implementation.

To further reference voltage variations, a direct current (DC) or low frequency regulated current may supply the average charges being transferred during the SAR conversion (DC effect compensation by the) to the reference capacitor Cref. After SAR conversion is complete, Vref measurement 205 (e.g., the comparator 305) in the control loop 230 compares the resulting voltage Vref on the reference capacitor Cref to the external master reference voltage Vref,master, and adds/subtracts charge to/from the reference capacitor Cref according to the result of the comparison. This can be done via switched capacitor principles, and/or via current source based charge pump principles. This ensures that for the next SAR ADC 10 conversion, the voltage stored on the reference capacitor Cref equals and/or is close to the external master reference voltage Vref,master. Close in this context can mean closer than the bit accuracy requires or close with a constant offset.

Also, in accordance with exemplary embodiments, due to the fact that the feed-forward charge equalization circuit 220 may provide the knowledge of which capacitors (in the DAC capacitor array 402) are switching or using some statistical information and that the feed-forward charge equalization circuit 220 could cause the control loop 230 to inject similar charge to the Vref (with or without having Cref) right at that time, the bit accuracy of the SAR ADC 10 can be improved considerably and/or area on the wafer (for forming Cref) could be saved.

Although FIG. 4 illustrates one example of the SAR ADC 10, there are numerous implementations of SAR ADCs, but they all usually require a reference voltage Vref which can be provided by the reference generator 20. It is understood that exemplary embodiments are not meant to be limited to SAR ADC DAC capacitor arrays, but could also be used for other ADCs requiring a low-impedance voltage reference Vref.

Additionally, exemplary embodiments are also applicable to DAC implementations in which the reference generator 20 can provide Vref to a DAC.

Figure 5:
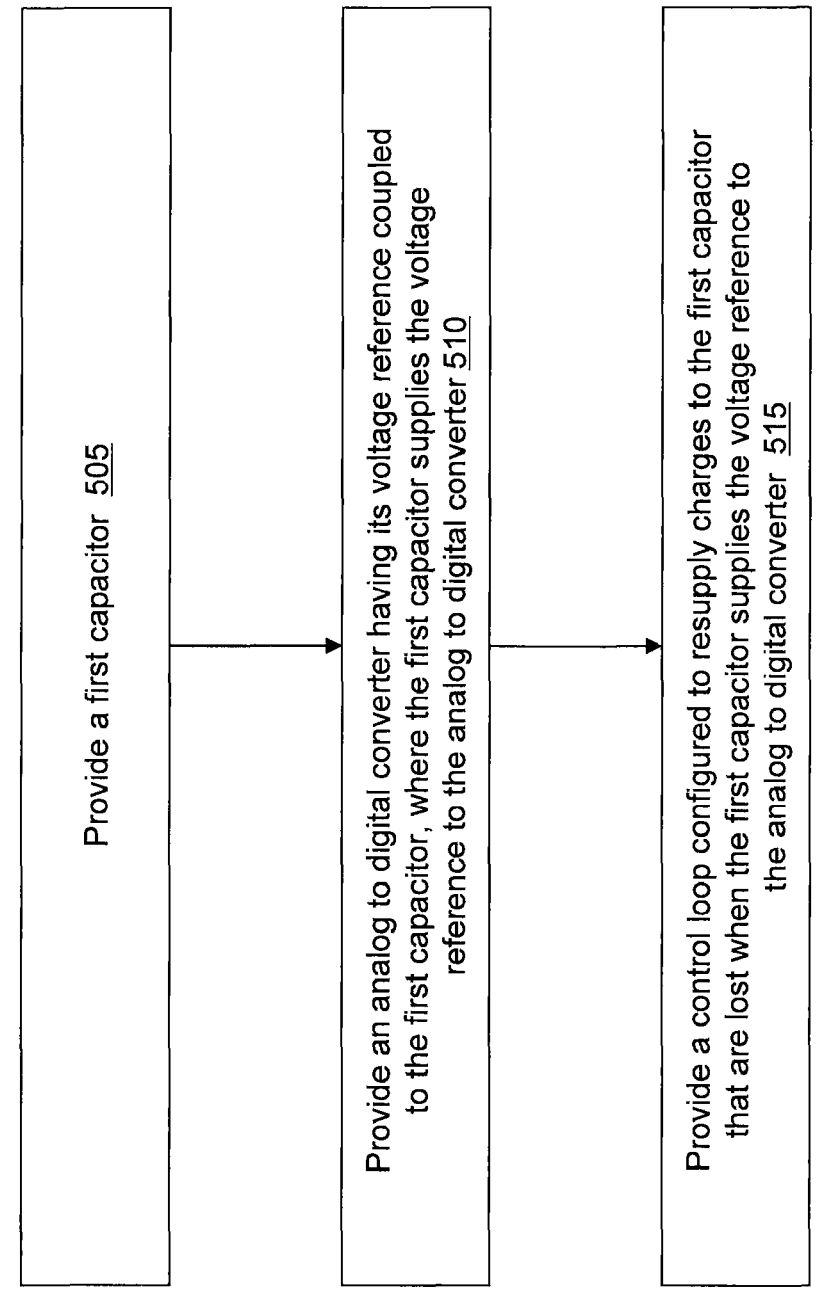
FIG. 5 illustrates a flow chart in accordance with exemplary embodiments.

FIG. 5 illustrates a flow chart 500 for configuring a circuit for the reference voltage generator 20 according to exemplary embodiments.

A first capacitor Cref is provided at block 505.

An analog to digital converter such as the SAR ADC 10 is provided having its voltage reference (e.g., Vref,P) coupled to (Vref of) the first capacitor such that the first capacitor supplies the voltage reference Vref to the analog to digital converter at block 510. Vref,N of the SAR ADC 10 may be coupled to ground or a different reference generator 20.

The control loop 230 is configured to resupply charges to the first capacitor Cref that are lost when the first capacitor Cref supplies the voltage reference Vref to the analog to digital converter (i.e., SAR ADC 10) at block 515.

Further, the first capacitor Cref is a plurality of deep trench capacitors, which may be formed under the analog to digital converter SAR ADC 10 on a wafer (not shown). The control loop 230 may include the comparator 305, in which a first input "+" of the comparator 305 is coupled to a main voltage reference supply Vref,master and a second input "−" is coupled to the first capacitor Cref at a junction in which the voltage reference Vref is supplied to the analog to digital converter 10. The output of the comparator 305 is coupled to gates of a first transistor T1 and a second transistor T2, where the source of the first transistor T1 is coupled to a voltage source VDD. The drain of the first transistor T1 is coupled to a second capacitor $C_{recharge}$ and coupled to a drain of the second transistor T2. The drain of the second transistor T2 is coupled to the first capacitor Cref at the junction of the voltage reference Vref. The comparator 305 compares the main voltage Vref,master to the voltage reference Vref at the first capacitor Cref.

In response to the comparator 305 determining that the voltage reference Vref is below the main voltage Vref,master by a predefined amount, the output of the comparator 305 turns on the second transistor T2 to cause the second capacitor $C_{recharge}$ to charge the first capacitor Cref, while turning off the first transistor T1. When the comparator 305 is in reset state, the second capacitor Crecharge is recharged to VDD.

Also, the feed-forward charge equalization circuit 220 is configured to resupply charges to the first capacitor Cref based on runtime-information or statistical information about the analog to digital converter (i.e., SAR ADC 10), and the feed-forward charge equalization circuit 220 may be a replica circuit of capacitors in the digital to analog converter array 402 of the analog to digital converter SAR ADC 10 or some simpler static means of resupplying charges during the conversion cycle.

Figure 6:
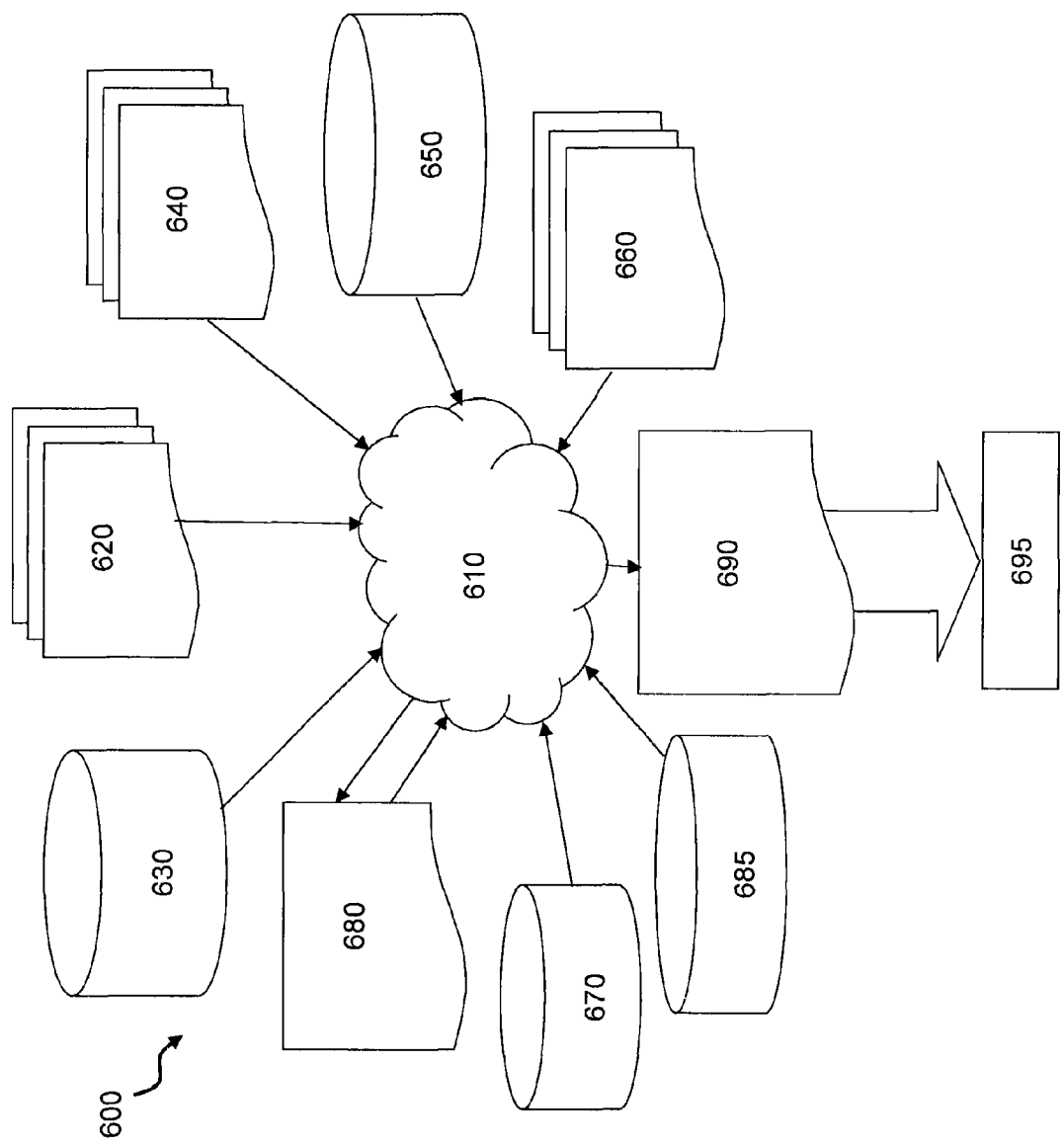
FIG. 6 illustrates a flow diagram of a design process used in semiconductor design, manufacture, and/or test in accordance with exemplary embodiments.

FIG. 6 illustrates a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown in FIGS. 2, 3, and 4. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 2, 3, and 4. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 2, 3, and 4 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 22 nm, 32 nm, 45 nm, 65 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc. Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2, 3, and 4. In one embodiment, design structure 690 may comprise a compiled, executable HDL simulation model that functionally simulates the devices shown in FIGS. 2, 3, and 4.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2, 3, and 4. Design structure 690 may then proceed to a stage 695 where, for example, design structure 690: proceeds to tape-out, is released to manufacturing, is released to a mask house, is sent to another design house, is sent back to the customer, etc.

As technical effects, exemplary embodiments provide a new design for an ADC reference voltage generator. The new design can be utilized with 100 GB Ethernet systems. Exemplary embodiments can provide a very power efficient design at very high speed. For example, features of the reference generator 20 configured with an ADC (or another circuit) include significantly lower power, less noise, self-contained, isolated, no current drawn from the external master reference. The latter two features are of particular importance for interleaved ADCs because they address the big issues of interaction between ADCs via a common reference, and the reference voltage drop due to currents flowing in wires that connect the traditional reference with the SAR capacitor array in the case of a common shared reference.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. A circuit for a reference voltage generator, the circuit comprising:
    a first capacitor;
    an analog to digital converter having its voltage reference coupled to the first capacitor, wherein the first capacitor supplies the voltage reference to the analog to digital converter;
    a control loop, configured to resupply charges to the first capacitor that are lost when the first capacitor supplies the voltage reference to the analog to digital converter, the control loop comprises:
    a second capacitor connected to a comparator in which the comparator causes the second capacitor to charge the first capacitor in response to the comparator determining that the voltage reference is less than a main voltage;
    output of the comparator coupled to gates of a first transistor and a second transistor;
    a source of the first transistor coupled to a voltage source;
    a drain of the first transistor coupled to the second capacitor and coupled to a drain of the second transistor; and
    a source of the second transistor coupled to the first capacitor at the junction of the voltage reference;
    the second capacitor electrically connected to the first capacitor through the second transistor to charge the first capacitor when the second transistor is turned on by the comparator.

2. The circuit of claim 1, wherein the first capacitor is at least one of a plurality of deep trench capacitors, a plurality of dynamic random access memory capacitors, and a plurality of metal-insulator-metal capacitors.

3. The circuit of claim 2, wherein the plurality of deep trench capacitors are formed under the analog to digital converter on a wafer.

4. The circuit of claim 1, further comprising the comparator in the control loop;
   wherein a first input of the comparator is coupled to a main voltage supply and a second input is coupled to the first capacitor at junction in which the voltage reference is supplied to the analog to digital converter.

5. The circuit of claim 1, wherein the comparator compares the main voltage to the voltage reference at the first capacitor.

6. The circuit of claim 5, wherein in response to the comparator determining that the voltage reference is below the main voltage by a predefined amount, the output of the comparator turns on the second transistor to cause the second capacitor to charge the first capacitor.

7. The circuit of claim 1, further comprising a feed-forward charge equalization.

8. The circuit of claim 7, wherein the feed-forward charge equalization is configured to cause a second capacitor to resupply charges to the first capacitor during offset calibration of an analog to digital converter.

9. The circuit of claim 7, wherein the feed-forward charge equalization is a replica circuit of capacitors in a digital to analog converter array of the analog to digital converter.

10. A method for configuring a circuit for a reference voltage generator, the method comprising:
   providing a first capacitor;
   providing an analog to digital converter having its voltage reference coupled to the first capacitor, wherein the first capacitor supplies the voltage reference to the analog to digital converter; and
   operating a control loop to resupply charges to the first capacitor that are lost when the first capacitor supplies the voltage reference to the analog to digital converter, the control loop comprises:
   a second capacitor connected to a comparator in which the comparator causes the second capacitor to charge the first capacitor in response to the comparator determining that the voltage reference is less than a main voltage;
   output of the comparator coupled to gates of a first transistor and a second transistor;
   a source of the first transistor coupled to a voltage source;
   a drain of the first transistor coupled to the second capacitor and coupled to a drain of the second transistor; and
   a source of the second transistor coupled to the first capacitor at the junction of the voltage reference;
   the second capacitor electrically connected to the first capacitor through the second transistor to charge the first capacitor when the second transistor is turned on by the comparator.

11. The method of claim 10, wherein the first capacitor is a plurality of deep trench capacitors.

12. The method of claim 10, wherein the plurality of deep trench capacitors are formed under the analog to digital converter on a wafer.

13. The method of claim 10, wherein the first capacitor is a plurality of dynamic random access memory capacitors each respectively coupled to a transistor.

* * * * *